United States Patent
Jung et al.

(10) Patent No.: US 10,339,857 B2
(45) Date of Patent: *Jul. 2, 2019

(54) ORGANIC LIGHT EMITTING DISPLAY DEVICE

(71) Applicant: Samsung Display Co., Ltd., Yongin-si, Gyeonggi-do (KR)

(72) Inventors: Chan-Sung Jung, Yongin-si (KR); Jae-Won Choi, Yongin-si (KR); Tae-Hyeog Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/640,238

(22) Filed: Jun. 30, 2017

(65) Prior Publication Data

US 2017/0301287 A1   Oct. 19, 2017

Related U.S. Application Data

(63) Continuation of application No. 14/849,447, filed on Sep. 9, 2015, now Pat. No. 9,721,497, which is a
(Continued)

(30) Foreign Application Priority Data

Feb. 12, 2013  (KR) .................. 10-2013-0014972

(51) Int. Cl.
*H01J 1/62* (2006.01)
*G09G 3/3208* (2016.01)
(Continued)

(52) U.S. Cl.
CPC ............. *G09G 3/3208* (2013.01); *G09G 3/32* (2013.01); *G09G 5/02* (2013.01); *H01L 27/326* (2013.01);
(Continued)

(58) Field of Classification Search
None
See application file for complete search history.

(56) References Cited

U.S. PATENT DOCUMENTS 7,719,185 B2   5/2010  Jin et al.
8,498,038 B2 * 7/2013  Noh .................... G02F 1/15
                                              359/273
(Continued)

FOREIGN PATENT DOCUMENTS

CN   1988169 A   6/2007
CN   101303503 A   11/2008
(Continued)

OTHER PUBLICATIONS

Korean Patent Abstract, Publication No. 10-2010-0082211 A, dated Jul. 16, 2010 for corresponding Korean Patent 10-0994117 B1, 1 page.
(Continued)

*Primary Examiner* — Vip Patel
(74) *Attorney, Agent, or Firm* — Lewis Roca Rothgerber Christie LLP

(57) ABSTRACT

An organic light emitting display device includes a plurality of pixels, each of the plurality of pixels including: a first sub-pixel configured to emit light of a first color; a second sub-pixel configured to emit light of a second color that is different from the first color; a third sub-pixel configured to emit light of a third color that is different from the first and second colors; and a transmission sub-pixel configured to selectively transmit external light in response to an electrical signal.

17 Claims, 6 Drawing Sheets

Related U.S. Application Data continuation of application No. 13/975,265, filed on Aug. 23, 2013, now Pat. No. 9,159,295.

(51) Int. Cl.
*G09G 5/02* (2006.01)
*G09G 3/32* (2016.01)
*H01L 27/32* (2006.01)

(52) U.S. Cl.
CPC ... *H01L 27/3232* (2013.01); *G09G 2300/046* (2013.01)

(56) References Cited

U.S. PATENT DOCUMENTS

| | | | |
|---|---|---|---|
| 8,569,773 B2 | 10/2013 | Yim et al. | |
| 8,692,817 B2 | 4/2014 | Hong | |
| 8,963,129 B2 | 2/2015 | Chung et al. | |
| 2007/0057932 A1 | 3/2007 | Shin et al. | |
| 2008/0278792 A1 | 11/2008 | Jang et al. | |
| 2009/0244101 A1 | 10/2009 | Langendijk et al. | |
| 2009/0321728 A1 | 12/2009 | Seo | |
| 2010/0060825 A1 | 3/2010 | Jang et al. | |
| 2010/0182673 A1* | 7/2010 | Jang | G02F 1/1334 359/270 |
| 2011/0249211 A1 | 10/2011 | Song et al. | |
| 2011/0303906 A1 | 12/2011 | Goldmann | |
| 2012/0032175 A1 | 2/2012 | Wang et al. | |
| 2012/0104422 A1 | 5/2012 | Lee et al. | |
| 2012/0169683 A1 | 7/2012 | Hong | |
| 2012/0268696 A1 | 10/2012 | Yim et al. | |

FOREIGN PATENT DOCUMENTS

| | | |
|---|---|---|
| CN | 101673525 A | 3/2010 |
| CN | 102751312 A | 10/2012 |
| KR | 10-0994117 B1 | 11/2010 |
| KR | 10-2011-0110590 A | 10/2011 |
| KR | 10-2011-0112364 A | 10/2011 |
| KR | 10-2011-0122513 A | 11/2011 |
| KR | 10-2012-0079318 A | 7/2012 |
| KR | 10-2012-0120704 A | 11/2012 |
| KR | 10-2012-0120705 A | 11/2012 |
| TW | 200627367 | 8/2006 |
| TW | 201230322 A1 | 7/2012 |

OTHER PUBLICATIONS

Taiwanese Office Action dated Mar. 8, 2017, for corresponding Taiwan Patent Application No. 102133584 (8 pages).

* cited by examiner

ORGANIC LIGHT EMITTING DISPLAY DEVICE

CROSS-REFERENCE TO RELATED APPLICATION

This application is a continuation of U.S. patent application Ser. No. 14/849,447, filed Sep. 9, 2015, which is a continuation of U.S. patent application Ser. No. 13/975,265, filed Aug. 23, 2013, now U.S. Pat. No. 9,159,295, which claims priority to and the benefit of Korean Patent Application No. 10-2013-0014972, filed Feb. 12, 2013, the entire content of both of which is incorporated herein by reference.

BACKGROUND

1. Field

Embodiments of the present invention relate to an organic light emitting display device.

2. Description of the Related Art

Organic light emitting display devices are being widely applied to personal portable devices such as MP3 players, mobile phones, and TVs due to their superior characteristics such as wide viewing angles, high contrast, fast response speed, and low power consumption. Such an organic light emitting display device has a self-emission property, and thus, an additional light source is not necessary, unlike a liquid crystal display (LCD) device, and therefore a thickness and a weight of the organic light emitting display device may be reduced. Also, an organic light emitting display device may be formed as a transparent display device by including transparent thin film transistors (TFTs) or organic light emitting diodes therein or by forming a transmission region (or transmission window) that is separate from pixel regions.

However, such a transparent organic light emitting display device has a fixed transmittance so as not to meet the demand of a user who wants to adjust a transmittance of the organic light emitting display device.

SUMMARY

Embodiments of the present invention provide an organic light emitting display device capable of adjusting a transmittance thereof.

According to an aspect of the present invention, there is provided an organic light emitting display device including a plurality of pixels, each of the plurality of pixels including: a first sub-pixel configured to emit light of a first color; a second sub-pixel configured to emit light of a second color that is different from the first color; a third sub-pixel configured to emit light of a third color that is different from the first and second colors; and a transmission sub-pixel configured to selectively transmit external light in response to an electrical signal.

The first, second, and third sub-pixels may respectively include a first sub-pixel electrode, a second sub-pixel electrode, and a third sub-pixel electrode that are separate from each other, and the transmission sub-pixel includes a transmission sub-pixel electrode that is separate from the first, second, and third sub-pixel electrodes.

The organic light emitting display device may further include: a first driving circuit, a second driving circuit, and a third driving circuit that are electrically coupled to the first, second, and third sub-pixel electrodes, respectively; and a switching line electrically coupled to the transmission sub-pixel electrode.

The organic light emitting display device may further include: a first driving circuit, a second driving circuit, and a third driving circuit that are electrically coupled to the first, second, and third sub-pixel electrodes, respectively; and a transmission driving circuit electrically coupled to the transmission sub-pixel electrode.

The transmission driving circuit may be at the transmission sub-pixel.

The transmission driving circuit may be at one of the first, second, and third sub-pixels adjacent the transmission sub-pixel.

The organic light emitting display device may further include an opposite electrode at each of the plurality of pixels and facing the first, second, and third sub-pixel electrodes and the transmission sub-pixel electrode.

The transmission sub-pixel may be configured to transmit the external light when the electrical signal is not applied, and to block transmission of the external light when the electrical signal is applied.

The transmission sub-pixel may be configured to transmit the external light when the electrical signal is not applied, and to emit light of one of the first, second, and third colors when the electrical signal is applied.

The transmission sub-pixel may be configured to transmit the external light when the electrical signal is not applied, and to emit light of a fourth color that is different from the first, second, and third colors when the electrical signal is applied.

Each of the pixels may further include a fourth sub-pixel that is configured to emit light of a fourth color that is different from the first, second, and third colors.

According to another aspect of the present invention, there is provided an organic light emitting display device including a plurality of pixels, each of the plurality of pixels including: an emission sub-pixel configured to display an emission image; and a transmission sub-pixel configured to selectively display a transmission image by external light transmitted through the transmission sub-pixel.

The emission sub-pixel may include an emission sub-pixel electrode, and the transmission sub-pixel may include a transmission sub-pixel electrode.

The organic light emitting display device may further include: an emission driving circuit electrically coupled to the emission sub-pixel electrode; and a switching line electrically coupled to the transmission sub-pixel electrode.

The organic light emitting display device may further include: an emission driving circuit electrically coupled to the emission sub-pixel electrode; and a transmission driving circuit electrically coupled to the transmission sub-pixel electrode.

The transmission driving circuit may be at the transmission sub-pixel.

The transmission driving circuit may be at the emission sub-pixel adjacent to the transmission sub-pixel.

The organic light emitting display device may further include an opposite electrode at each of the plurality of pixels and facing the emission sub-pixel electrode and the transmission sub-pixel electrode.

The transmission sub-pixel may be configured to display the transmission image when an electrical signal is not applied and not to display the transmission image when the electrical signal is applied.

The transmission sub-pixel may be configured to display the transmission image when an electrical signal is not applied and to display the emission image when the electrical signal is applied.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described in detail below with reference to accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
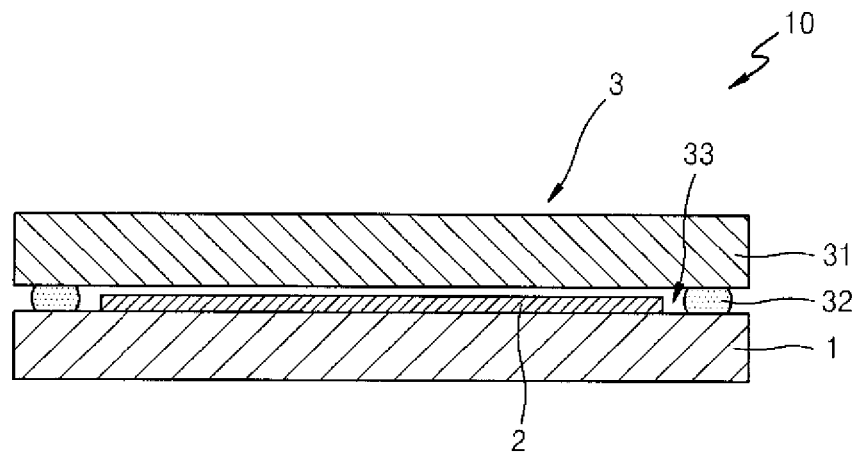
FIG. 1 is a cross-sectional view of an organic light emitting display device according to an embodiment of the present invention.
Figure 2:
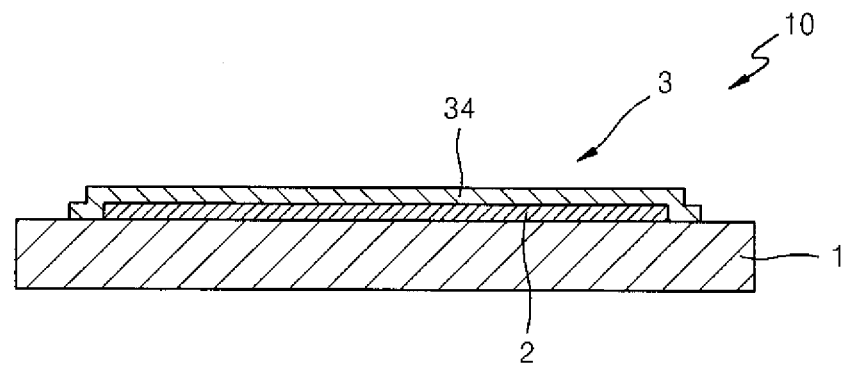
FIG. 2 is a cross-sectional view of an organic light emitting display device according to another embodiment of the present invention.

FIGS. 1 and 2 are cross-sectional views of organic light emitting display devices according to different embodiments of the present invention.

Referring to FIG. 1, the organic light emitting display device 10 of the present embodiment includes an organic emission unit 2 formed on a surface of a substrate 1, and a sealing unit 3 for sealing the organic emission unit 2.

According to the embodiment shown in FIG. 1, the sealing unit 3 may include a sealing substrate 31. The sealing substrate 31 may be formed of a transparent glass substrate or a transparent plastic substrate so as to display images from the organic emission unit 2. The sealing substrate 31 may also reduce (or prevent) external air and moisture from infiltrating into the organic emission unit 2.

Edges of the substrate 1 and the sealing substrate 31 are coupled to each other by a sealing material (or sealant) 32 so that a space 33 between the substrate 1 and the sealing substrate 31 may be sealed. Moisture absorbent or a filling material may be located in the space 33.

Instead of using the sealing substrate 31, as shown in FIG. 2, a thin sealing film 34 may be formed on the organic emission unit 2 to protect the organic emission unit 2 from external air. The sealing film 34 may have a structure in which a layer formed of an inorganic material such as silicon oxide (e.g., $SiO_2$) or silicon nitride (e.g., $Si_3N_4$) and a layer formed of an organic material such as epoxy or polyimide are alternately formed. However, embodiments of the present invention are not limited thereto, and a sealing structure formed of a transparent thin film may be used as the sealing film 34.

The organic light emitting display devices according to the embodiments shown in FIGS. 1 and 2 may be realized as a bottom emission type that displays images toward the substrate 1, a top emission type that displays images toward the sealing substrate 31 or the sealing film 34, or a dual-emission type that displays images toward both the substrate 1 and the sealing substrate 31 or toward both the substrate 1 and the sealing film 34.

Such an organic light emitting display device 10 may include a light emission region and a light transmission region so as to realize a transparent and/or see-through display device.

Figure 3:
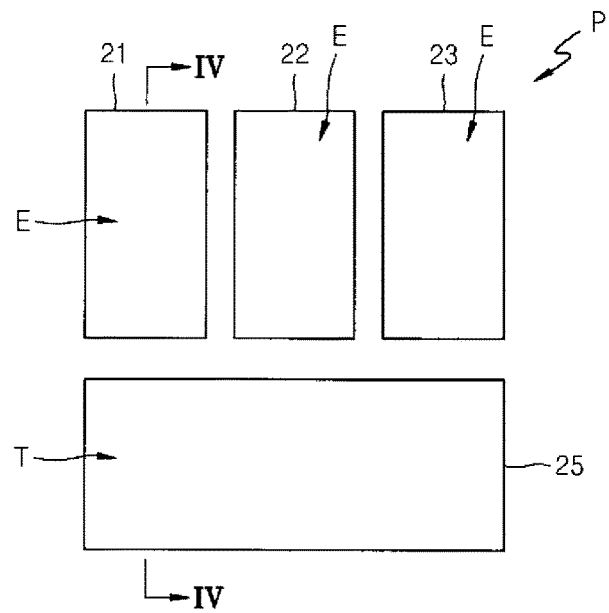
FIG. 3 is a plan view of a pixel in the organic emission unit shown in FIG. 1 and FIG. 2.

The organic emission unit 2 shown in FIG. 1 or FIG. 2 includes a plurality of pixels for displaying images. FIG. 3 is a plan view of a pixel P in the organic emission unit 2 shown in FIG. 1 and/or FIG. 2.

Each of the pixels includes emitting sub-pixels E for realizing light emission images, and a transmission sub-pixel 25 forming a transmission region T so as to transmit external light to form a transmission image.

The emission sub-pixels E may include a first sub-pixel 21, a second sub-pixel 22, and a third sub-pixel 23. The first sub-pixel 21 emits light of a first color, the second sub-pixel 22 emits light of a second color, and the third sub-pixel 23 emits light of a third color. The second color is different from the first color, and the third color is different from the first color and the second color. The first through third colors may be three different kinds of colors for realizing white light, for example, they may be red, green, and blue according to embodiments of the present invention.

The transmission sub-pixel 25 forming the transmission region T may be adjacent to the first through third sub-pixels 21, 22, and 23. In FIG. 3, one transmission sub-pixel 25 forms the transmission region T; however, embodiments of the present invention are not limited thereto, that is, a transmission sub-pixel adjacent to the first sub-pixel 21, another transmission sub-pixel adjacent to the second sub-pixel 22, and another transmission sub-pixel adjacent to the third sub-pixel 23 may be located independently (e.g., separated or spaced) from each other.

The transmission sub-pixel 25 is configured to selectively transmit external light (e.g., allows external light to pass through) according to application of an electric signal.

Figure 4:
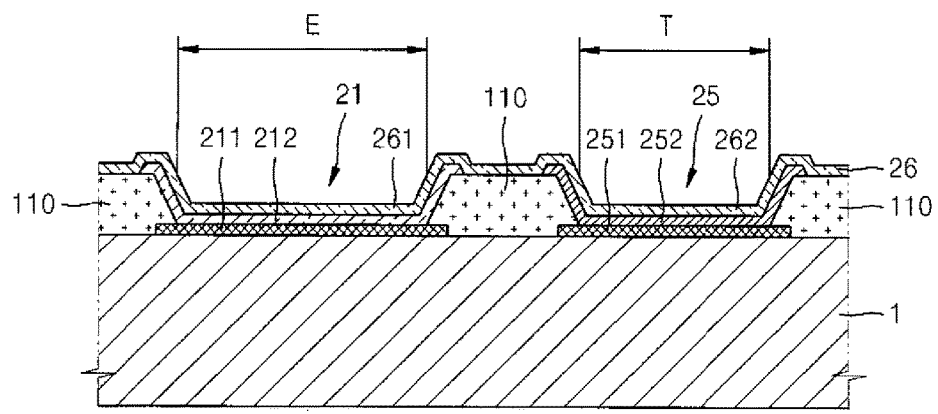
FIG. 4 is a cross-sectional view of the pixel taken along the line IV-IV of FIG. 3.

FIG. 4 is a cross-sectional view of the pixel taken along the line IV-IV of FIG. 3.

The first sub-pixel 21 includes a first sub-pixel electrode 211, a first emission layer 212 located on the first sub-pixel electrode 211, and an emission opposite electrode 261 located on the first emission layer 212.

The transmission sub-pixel 25 includes a transmission sub-pixel electrode 251, a transmission adjusting layer 252 located on the transmission sub-pixel electrode 251, and a transmission opposite electrode 262 located on the transmission adjusting layer 252. The transmission opposite electrode 262 may be electrically connected to the emission opposite electrode 261, for example, the transmission opposite electrode 262 and the emission opposite electrode 261 may be coupled to each other to form one opposite electrode 26.

The first sub-pixel electrode 211 and the transmission sub-pixel electrode 251 may be located on the substrate 1 independently (e.g., separately) from each other.

An insulating layer 110 is formed on the substrate 1 so as to cover edges of the first sub-pixel electrode 211 and the transmission sub-pixel electrode 251, and the first sub-pixel electrode 211 and the transmission sub-pixel electrode 251 are exposed through openings (or gaps) of the insulating layer 110.

The first emission layer 212 and the transmission adjusting layer 252 are formed on the exposed portions of the first sub-pixel electrode 211 and the transmission sub-pixel electrode 251, and the opposite electrode 26 is formed on the first emission layer 212, the transmission adjusting layer 252, and the insulating layer 110.

The substrate 1 may include driving circuit units (or driving circuits or drivers) that are electrically connected to the sub-pixel electrodes. Each of the driving circuit units may include at least a thin film transistor (TFT) and a capacitor.

Figure 5:
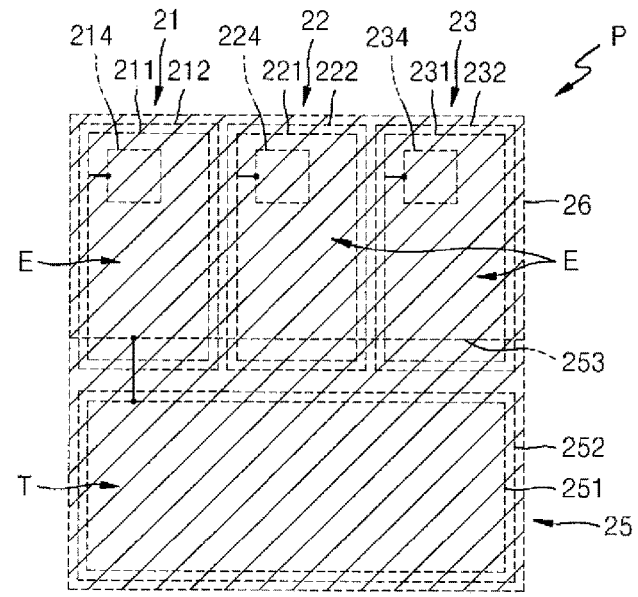
FIG. 5 is a plan view of the pixel of FIG. 3 in more detail.

FIG. 5 is a plan view of the pixel P shown in FIG. 3 in more detail.

The first sub-pixel 21, the second sub-pixel 22, and the third sub-pixel 23 respectively include the first sub-pixel electrode 211, the second sub-pixel electrode 221, and the third sub-pixel electrode 231, which are independent from each other. In addition, the transmission sub-pixel 25 includes the transmission sub-pixel electrode 251 that is independent from the first sub-pixel electrode 211, the second sub-pixel electrode 221, and the third sub-pixel electrode 231. The transmission sub-pixel electrode 251 may be disposed (or located) adjacent to all of the first, second, and third sub-pixel electrodes 211, 221, and 231 as shown in FIG. 5.

The first sub-pixel 21, the second sub-pixel 22, and the third sub-pixel 23 respectively include the first emission layer 212, the second emission layer 222, and the third emission layer 232 that respectively cover the first sub-pixel electrode 211, the second sub-pixel electrode 221, and the third sub-pixel electrode 231. The transmission sub-pixel 25 includes the transmission adjusting layer 252 that covers the transmission sub-pixel electrode 251.

The opposite electrode 26 is formed to cover all of the pixel P, for example, to cover the first, second, and third emission layers 212, 222, and 232, and the transmission adjusting layer 252. Although not shown in FIG. 5, the opposite electrode 26 may be formed to cover all of the pixels.

The first, second, and third sub-pixels 21, 22, and 23 may function as anodes, and the opposite electrode 26 may function as a cathode, or vice versa.

The first emission layer 212, the second emission layer 222, and the third emission layer 232 may be organic emission layers, and may respectively include an organic emission material emitting red light, an organic emission material emitting green light, and an organic emission material emitting blue light. Although not shown in FIG. 5, at least one or more organic layers including a hole injection transport layer and/or an electron injection transport layer may be further disposed (or located) between the first, second, and third sub-pixels 21, 22, and 23 and the opposite electrode 26. When the first, second, and third sub-pixels 21, 22, and 23 are anode electrodes and the opposite electrode 26 is a cathode electrode, an organic layer including the hole injection transport layer for injecting and/or transporting the holes may be disposed (or located) between the first, second, and third emission layers 212, 222, and 232 and the first, second, and third sub-pixels 21, 22, and 23, and an organic layer including the electron injection transport layer for injecting and/or transporting the electrons may be disposed (or located) between the first, second, and third emission layers 212, 222, and 232, and the opposite electrode 26. The hole injection transport layer and the electron injection transport layer may be common layers that may be formed to cover all the pixels of the organic emission unit 2.

The organic layers including the first emission layer 212, the second emission layer 222, and the third emission layer 232 may be formed in various ways, such as by vacuum deposition, printing, and/or laser thermal transfer methods.

The first sub-pixel electrode 211, the second sub-pixel electrode 221, and the third sub-pixel electrode 231 may be formed as transparent electrodes, semi-transparent electrodes, or reflective electrodes that may include indium tin oxide (ITO), indium zinc oxide (IZO), zinc oxide (ZnO), or indium (III) oxide ($In_2O_3$).

The opposite electrode 26 may be formed as a transparent electrode or a semi-transparent electrode including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or a compound thereof. The opposite electrode 26 may be configured to transmit light by forming the compound as a thin film.

The first sub-pixel 21, the second sub-pixel 22, and the third sub-pixel 23 may respectively include a first driving circuit unit (or first driving circuit or first driver) 214, a second driving circuit unit (or second driving circuit or second driver) 224, and a third driving circuit unit (or third driving circuit or third driver) 234. The first, second, and third driving circuit units 214, 224, and 234 may be electrically coupled to the first sub-pixel electrode 211, the second sub-pixel electrode 221, and the third sub-pixel electrode 231, respectively. Each of the first, second, and third driving circuit units 214, 224, and 234 may include a thin film transistor and a capacitor. The first, second, and third driving circuit units 214, 224, and 234 may control light emission images from the first sub-pixel 21, the second sub-pixel 22, and the third sub-pixel 23.

The transmission sub-pixel 25 may include a transmission sub-pixel electrode 251, a transmission adjusting layer 252, and a transmission opposite electrode 262 (refer to FIG. 3) that are sequentially stacked. The transmission sub-pixel 25 may transmit external light when an electric signal is not applied thereto, and may block the external light when an electric signal is applied thereto, or vice versa. To do this, the transmission sub-pixel 25 may include an electrochromic system.

The transmission sub-pixel electrode 251 may be formed of the same material as that of the first, second, and third sub-pixel electrodes 21, 22, and 23. The transmission adjusting layer 252 may be formed by using an electrochromic material. The transmission opposite electrode 262 may be formed integrally with the emission opposite electrode 261 to form the opposite electrode 26. However, embodiments of the present invention are not limited thereto; the transmission sub-pixel electrode 251 and the transmission opposite electrode 262 may be formed of an electrode material that is capable of adjusting a transmittance of the transmission adjusting layer 252. Although not shown in the drawings, the transmission sub-pixel 25 may further include a transmission opposite electrode patterned on the transmission sub-pixel 25 region.

As an example, the transmission sub-pixel electrode 251 and the transmission opposite electrode 262 may be formed of metal oxide, for example, nickel oxide (e.g., NiO) and tungsten oxide (e.g., $W_2O_3$), respectively. In addition, the transmission adjusting layer 252 disposed (or located)

between the transmission sub-pixel electrode 251 and the transmission opposite electrode 262 may be formed of a transparent electrolyte. When a voltage is applied between the transmission sub-pixel electrode 251 and the transmission opposite electrode 262, lithium ions leak out of the transmission sub-pixel electrode 251 that is formed of the nickel oxide and move to the transmission opposite electrode 262 formed of the tungsten oxide via the transmission adjusting layer 252, and accordingly, external light transmission through the transmission sub-pixel 25 may be blocked. If a small amount of lithium is added when the transmission sub-pixel electrode 251 is formed, the color variation may occur faster in wider range.

As another example, the transmission sub-pixel electrode 251 may be formed of ITO and the transmission adjusting layer 252 may be formed of an organic/metal hybrid polymer including iron (Fe) ions. In addition, the opposite electrode 26 may be formed to cover the transmission adjusting layer 252.

When an oxidation voltage is applied to the transmission sub-pixel electrode 251, metal ions in the organic/metal hybrid polymer are oxidated into trivalent form, a highest occupied molecular orbital (HOMO) level of the metal ions is lowered and a potential gap increases. Thus, absorption area is moved to an ultraviolet region, and thus, the organic/metal hybrid polymer is recognized as colorless. The organic/metal hybrid polymer may represent various colors according to the applied voltage by changing a kind of metal ions included therein. For example, the transmission sub-pixel 25 may display red, green, blue, and white according to the application of electric signals.

The transmission sub-pixel 25 may use various electrochromic devices.

As described above, because the transmission sub-pixel 25 selectively blocks transmission of the external light according to the application of electric signals, the transmission sub-pixel 25 may further include a switching line 253 electrically coupled to the transmission sub-pixel electrode 251 as shown in FIG. 5. The switching line 253 may be located adjacent to the transmission sub-pixel 25 in order not to interfere with the external transmission through the transmission sub-pixel 25. The switching line 253, for example, may be disposed (or located) to cross over the first sub-pixel 21 and the third sub-pixel 23.

Figure 6:
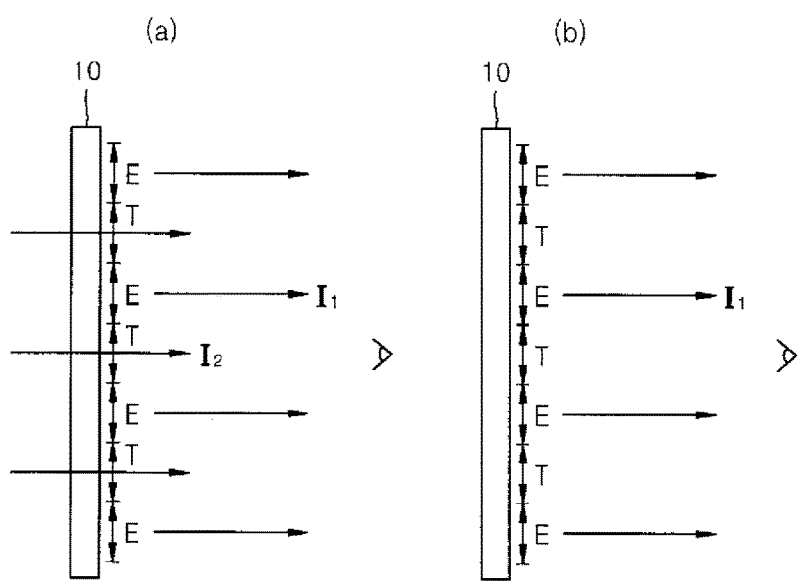
FIG. 6 is a diagram schematically showing operations of an organic light emitting display device including the pixel shown in FIG. 5.

As such, because the transmission sub-pixel 25 selectively transmits the external light (e.g., allows the external light to pass through), a first emission image $I_1$ is displayed from the emission sub-pixels E of the organic light emitting display device and a transmission image $I_2$ obtained from the external light transmitting through the transmission regions T is displayed as shown in FIG. 6(*a*), and accordingly, a user may see both the first emission image $I_1$ and the transmission image $I_2$. In addition, as shown in FIG. 6(*b*), when the transmission sub-pixels 25 selectively block the transmission of the external light, the first emission image $I_1$ is only displayed from the emission sub-pixels E of the organic light emitting display device 10 so that the user may see the first emission image $I_1$ only.

The transmission sub-pixels 25 may be configured to transmit external light when the electric signal is not applied thereto, and to emit light of a certain color when the electric signals are applied thereto. Here, the certain color may be one of the first through third colors, or may be a fourth color that is different from the first through third colors. To do this, the transmission adjusting layer 252 may be formed of an organic light emitting material or an electrochromic material as described above. Alternatively, in other embodiments, material transmitting external light when the electric signals are applied and emitting light of a certain color when the electric signals are not applied may be selected as the organic light emitting material.

Figure 7:
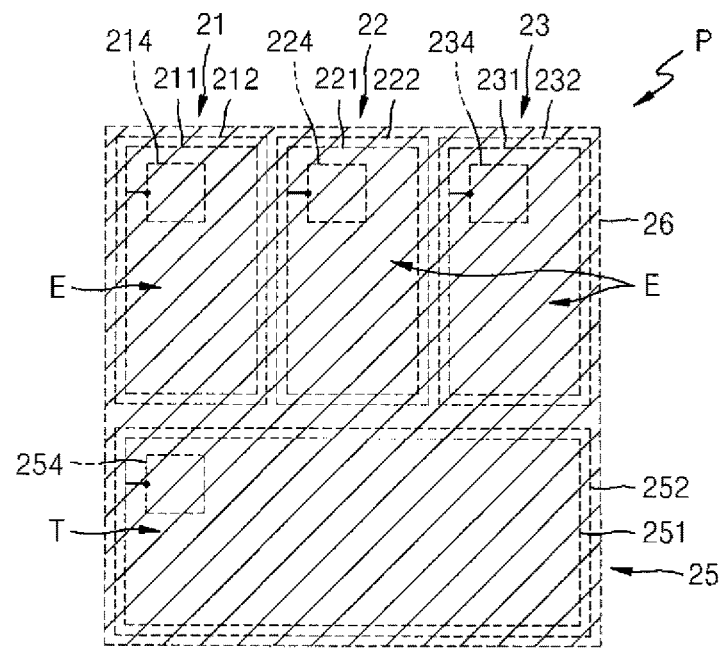
FIG. 7 is a plan view showing another example of the pixel shown in FIG. 3.

In this case, the transmission sub-pixel 25 may further include a transmission driving circuit unit (or transmission driving circuit or transmission driver) 254 that is electrically coupled to the transmission sub-pixel electrode 251 as shown in FIG. 7. The transmission driving circuit unit 254 may be configured to make the transmission sub-pixel 25 function as an emission sub-pixel displaying an emission image when the external light is not transmitted through the transmission sub-pixel 25, like the operation of first through third driving circuit units 214 through 234. For example, in a case where the transmission sub-pixel 25 emits one of red light, green light, blue light, or white light when the external light is not transmitted through the transmission sub-pixel 25, the transmission sub-pixel 25 may be used to represent a gray scale of the pixel P, with the first through third sub-pixels 21 through 23. Accordingly, white balance, color, and brightness of the pixels P may be easily adjusted.

Figure 8:
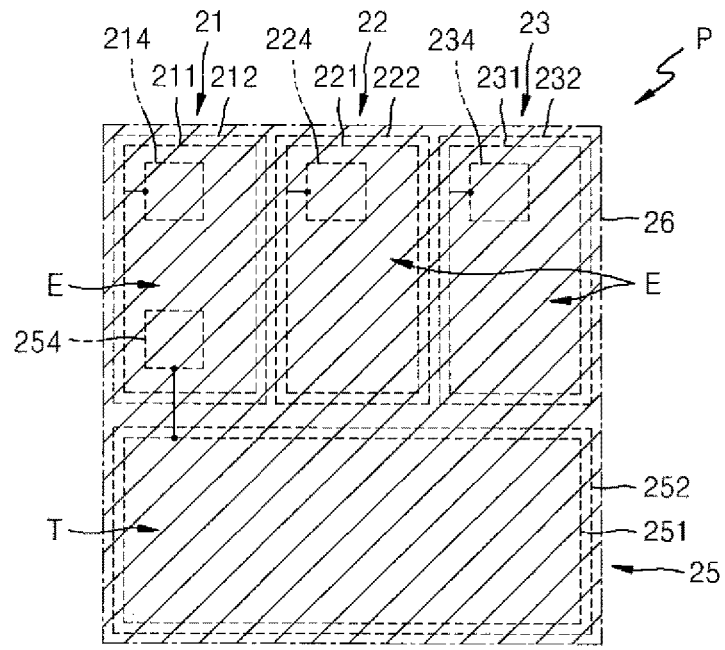
FIG. 8 is a plan view showing another example of the pixel shown in FIG. 3.

The transmission driving circuit unit 254 may be located in the transmission sub-pixel 25 as shown in FIG. 7; however, embodiments of the present invention are not limited thereto. That is, as shown in FIG. 8, the transmission driving circuit unit 254 may be located in one of the emission sub-pixels E adjacent to the transmission sub-pixel 25 so that the external light transmittance of the transmission sub-pixel 25 may not be degraded due to the transmission driving circuit unit 254.

Figure 9:
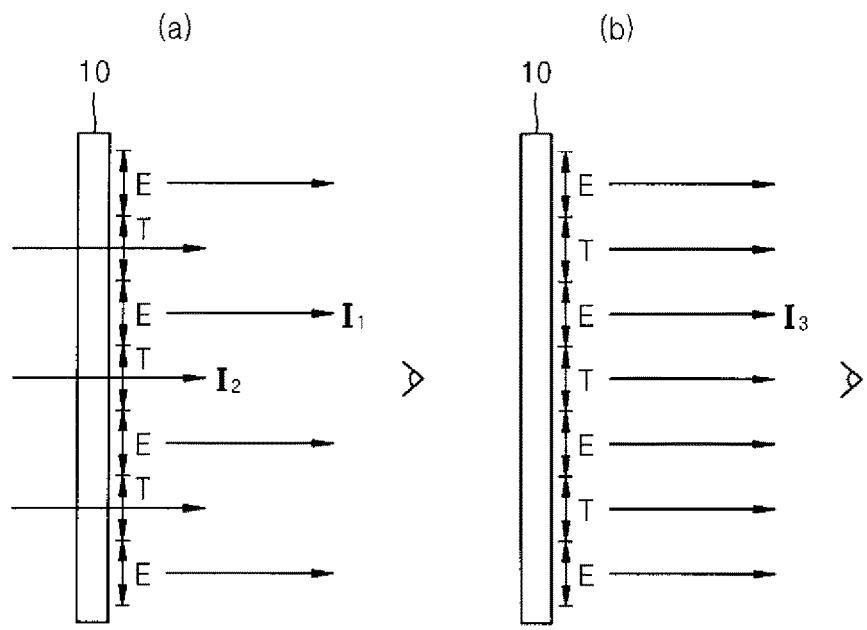
FIG. 9 is a diagram schematically showing operations of an organic light emitting display device including the pixel of FIG. 8.

When the transmission sub-pixels 25 selectively transmit the external light, the first emission image $I_1$ is displayed from the emission sub-pixels E of the organic light emitting display device 10 and the external light is transmitted through the transmission region T to display a transmission image $I_2$ as shown in FIG. 9(*a*), and thus, the user may see both the first emission image $I_1$ and the transmission image $I_2$. In addition, in a case where the transmission sub-pixels 25 selectively block the external light and emit light of a certain color, a second emission image $I_3$ is displayed from the emission sub-pixel E of the organic light emitting display device 10 so that the user only sees the second emission image $I_3$ as shown in FIG. 9(*b*). The second emission image $I_3$ may have increased (or improved) white balance, color, and brightness when compared with the first emission image $I_1$ because the transmission sub-pixel 25 functions as the emission sub-pixel representing the gray scale.

Figure 10:
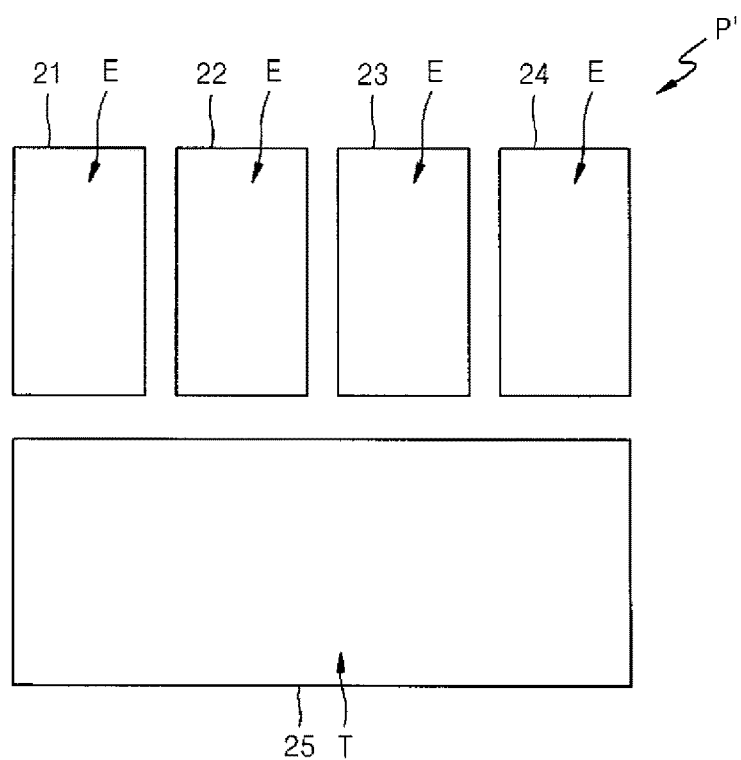
FIG. 10 is a plan view showing a pixel in another example of the organic emission unit shown in FIG. 1 and FIG. 2.

FIG. 10 is a plan view showing a pixel P' according to another embodiment in the organic light emission unit 2 shown in FIGS. 1 and 2.

The pixel P' shown in FIG. 10 may further include a fourth sub-pixel 24 in addition to the first through third sub-pixels 21 through 23 shown in FIG. 3. Full white light may be represented by the first through fourth sub-pixels 21 through 24 that respectively emit red light, green light, blue light, and white light. Other components may be the same as those of the previous embodiment, and thus, descriptions thereof may be omitted.

Figure 11:
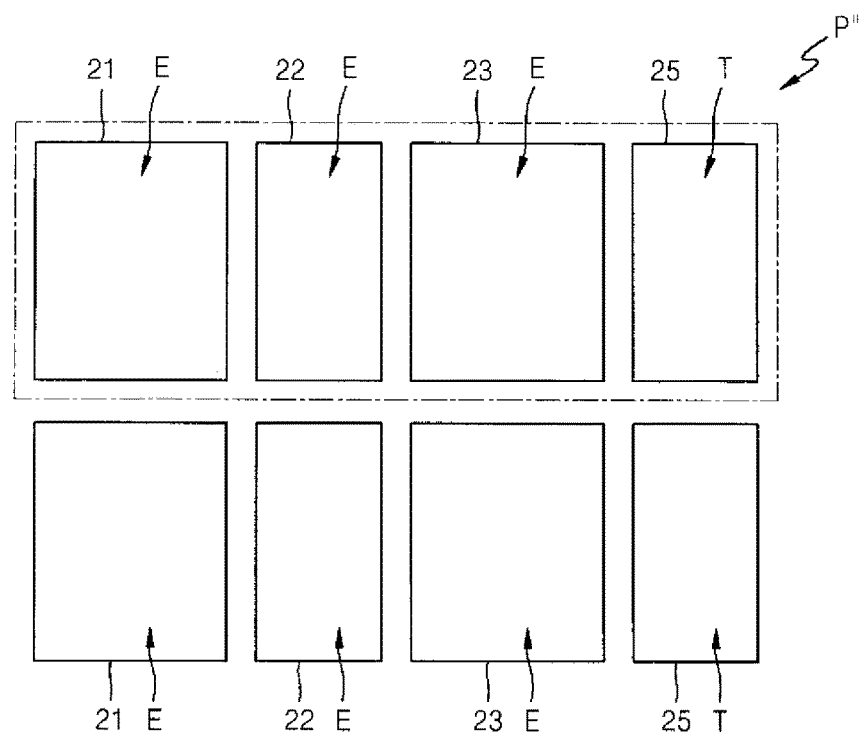
FIG. 11 is a plan view showing a pixel in another example of the organic emission unit shown in FIG. 1 and FIG. 2.

FIG. 11 is a plan view showing another example of a pixel P'' in the organic light emission unit 2 shown in FIGS. 1 and 2.

As shown in FIG. 11, the transmission sub-pixel 25 is located adjacent to the third sub-pixel 23.

In this case, if the first through third sub-pixels 21 through 23 respectively emit red light, green light, and blue light and the transmission sub-pixel 25 emits green light according to the electric signal, the pixel P'' may be configured as a PenTile Matrix when the external light is not transmitted therethrough, thereby increasing (or improving) resolution of the image.

In the pixel P''' of FIG. 11, a fourth sub-pixel emitting white light may be further disposed (or included) in addition to the first through third sub-pixels 21 through 23 emitting red light, green light, and blue light, thereby increasing (or improving) white balance.

According to aspects of the present invention, the organic light emitting display device capable of selectively controlling external light transmission may be provided.

In addition, the white balance, the color, and the brightness of the pixels may be increased (or improved) in a non-transmission mode.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display device comprising a plurality of pixels, at least one of the pixels comprising:
   a first sub-pixel configured to display a color; and
   a second sub-pixel configured to control level of transparency in response to an electric signal applied in the second sub-pixel.

2. The organic light emitting display device of claim 1, wherein the second sub-pixel comprises an electrochromic material.

3. The organic light emitting display device of claim 2, wherein the second sub-pixel comprises a first electrode, a second electrode, and a transparency adjusting layer between the two electrodes.

4. The organic light emitting display device of claim 3, wherein either the first electrode or the second electrode comprises a conductive metal oxide.

5. The organic light emitting display device of claim 3, wherein the transparency adjusting layer comprises a transparent electrolyte.

6. The organic light emitting display device of claim 3, wherein the transparency adjusting layer comprises an organic/metal hybrid polymer.

7. The organic light emitting display device of claim 2, wherein the first sub-pixel comprises an organic emission layer.

8. The organic light emitting display device of claim 1, further comprising an electrode extending from the first sub-pixel to the second sub-pixel.

9. The organic light emitting display device of claim 1, wherein the second sub-pixel is greater than double the size of the first sub-pixel.

10. The organic light emitting display device of claim 1, further comprising a third sub-pixel and a fourth sub-pixel,
    wherein the first sub-pixel is configured to display a first color, the third sub-pixel is configured to display a second color, and the fourth sub-pixel is configured to display a third color.

11. The organic light emitting display device of claim 10, wherein the first, second, third, and fourth sub-pixels are adjacent each other in a first direction.

12. The organic light emitting display device of claim 10, wherein the first, third, and fourth sub-pixels are adjacent each other in a first direction, and
    wherein the second sub-pixel is adjacent the first, third, and fourth sub-pixels in a second direction crossing the first direction.

13. The organic light emitting display device of claim 12, wherein the first, third, and fourth sub-pixels are sequentially arranged in the first direction,
    wherein a distance between an outermost edge of the first sub-pixel and an outermost edge of the fourth sub-pixel in the first direction is substantially the same as a distance from a first edge of the second sub-pixel to an opposite second edge of the second sub-pixel in the first direction.

14. The organic light emitting display device of claim 10, further comprising a fifth sub-pixel configured to display a fourth color.

15. The organic light emitting display device of claim 14, wherein the first, second, third, fourth, and fifth sub-pixels are adjacent each other in a first direction.

16. The organic light emitting display device of claim 14, wherein the first, third, fourth, and fifth sub-pixels are adjacent each other in a first direction, and
    wherein the second sub-pixel is adjacent the first, third, fourth, and fifth sub-pixels in a second direction crossing the first direction.

17. The organic light emitting display device of claim 16, wherein the first, third, fourth, and fifth sub-pixels are sequentially arranged in the first direction,
    wherein a distance between an outermost edge of the first sub-pixel and an outermost edge of the fifth sub-pixel in the first direction is substantially the same as a distance from a first edge of the second sub-pixel to an opposite second edge of the second sub-pixel in the first direction.

* * * * *